(12) United States Patent
Fushimi et al.

(10) Patent No.: US 11,255,885 B2
(45) Date of Patent: Feb. 22, 2022

(54) ELECTRIC POWER CONVERSION DEVICE

(71) Applicant: HONDA MOTOR CO., LTD., Tokyo (JP)

(72) Inventors: Takaaki Fushimi, Wako (JP); Toshiki Ikeda, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 58 days.

(21) Appl. No.: 16/405,021

(22) Filed: May 7, 2019

(65) Prior Publication Data

US 2019/0353686 A1 Nov. 21, 2019

(30) Foreign Application Priority Data

May 18, 2018 (JP) .............................. JP2018-096472

(51) Int. Cl.
| | |
|---|---|
| *G01R 19/00* | (2006.01) |
| *H02K 11/33* | (2016.01) |
| *H05K 7/14* | (2006.01) |
| *H02M 7/00* | (2006.01) |
| *H05K 7/20* | (2006.01) |
| *H02J 7/24* | (2006.01) |
| *H02P 27/06* | (2006.01) |
| *H02M 1/00* | (2006.01) |

(52) U.S. Cl.
CPC ............ *G01R 19/0092* (2013.01); *H02J 7/24* (2013.01); *H02K 11/33* (2016.01); *H02M 7/003* (2013.01); *H05K 7/1432* (2013.01); *H05K 7/20927* (2013.01); *H02M 1/0009* (2021.05); *H02P 27/06* (2013.01)

(58) Field of Classification Search
CPC ... G01R 19/0092; H02K 11/33; H05K 7/1432
See application file for complete search history.

(56) References Cited

U.S. PATENT DOCUMENTS

| | | | |
|---|---|---|---|
| 5,424,937 A * | 6/1995 | Iyotani | H02M 1/08 363/136 |
| 10,530,288 B2 * | 1/2020 | Shimomugi | H02P 27/08 |
| 10,765,044 B2 * | 9/2020 | Ikeda | H02M 7/003 |

(Continued)

FOREIGN PATENT DOCUMENTS

| | | |
|---|---|---|
| CN | 204231821 U | 3/2015 |
| JP | 2011040573 A | 2/2011 |

(Continued)

OTHER PUBLICATIONS

Office Action for Japanese application No. 2018-096472, dated Aug. 27, 2019, and partial English translation thereof, 9 pages.

(Continued)

*Primary Examiner* — Reena Aurora
(74) *Attorney, Agent, or Firm* — Armstrong Teasdale LLP

(57) ABSTRACT

An electric power conversion device including a converter ECU (51) configured to control a switching device (33) via a gate driver (52), and an electronically insulating support member (115) supporting the control unit. The support member is provided with a first surface (116) supporting the control unit, and a second surface (117) facing away from the first surface, a signal line connected to the control unit extending along at least one of the first surface and the second surface.

14 Claims, 12 Drawing Sheets

(56) References Cited

U.S. PATENT DOCUMENTS

| | | |
|---|---|---|
| 2011/0039376 A1 | 2/2011 | Yamashita et al. |
| 2017/0221632 A1 | 8/2017 | Ono et al. |
| 2019/0072804 A1 | 3/2019 | Sugiyama et al. |

FOREIGN PATENT DOCUMENTS

| | | |
|---|---|---|
| JP | 2013198255 A | 9/2013 |
| JP | 2017135901 A | 8/2017 |
| JP | 2018022731 A | 2/2018 |
| WO | 2017154664 A1 | 9/2017 |

OTHER PUBLICATIONS

China First Office Action for Application CN201910405204.6 dated Feb. 1, 2021; 18 pp.

\* cited by examiner

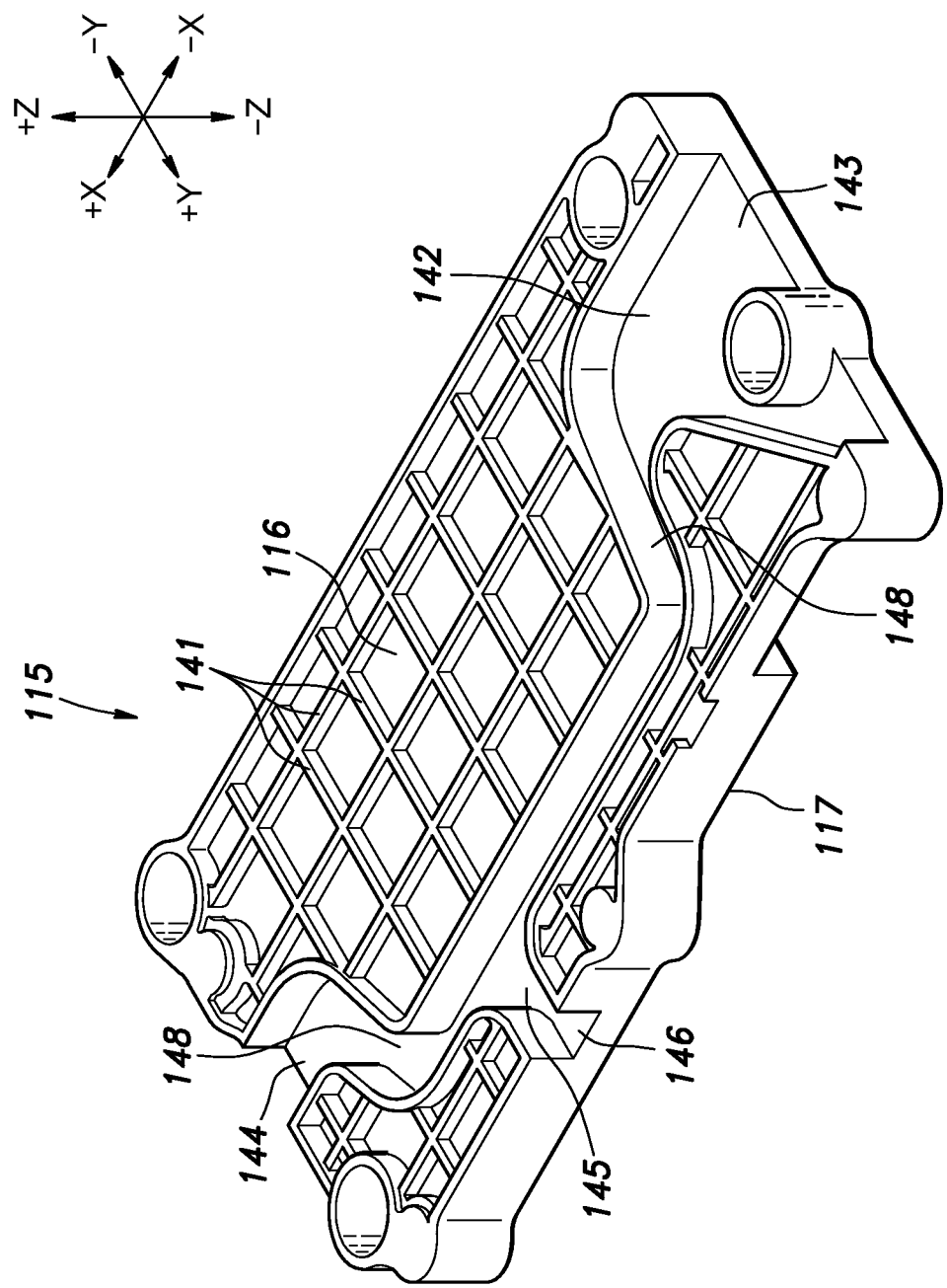

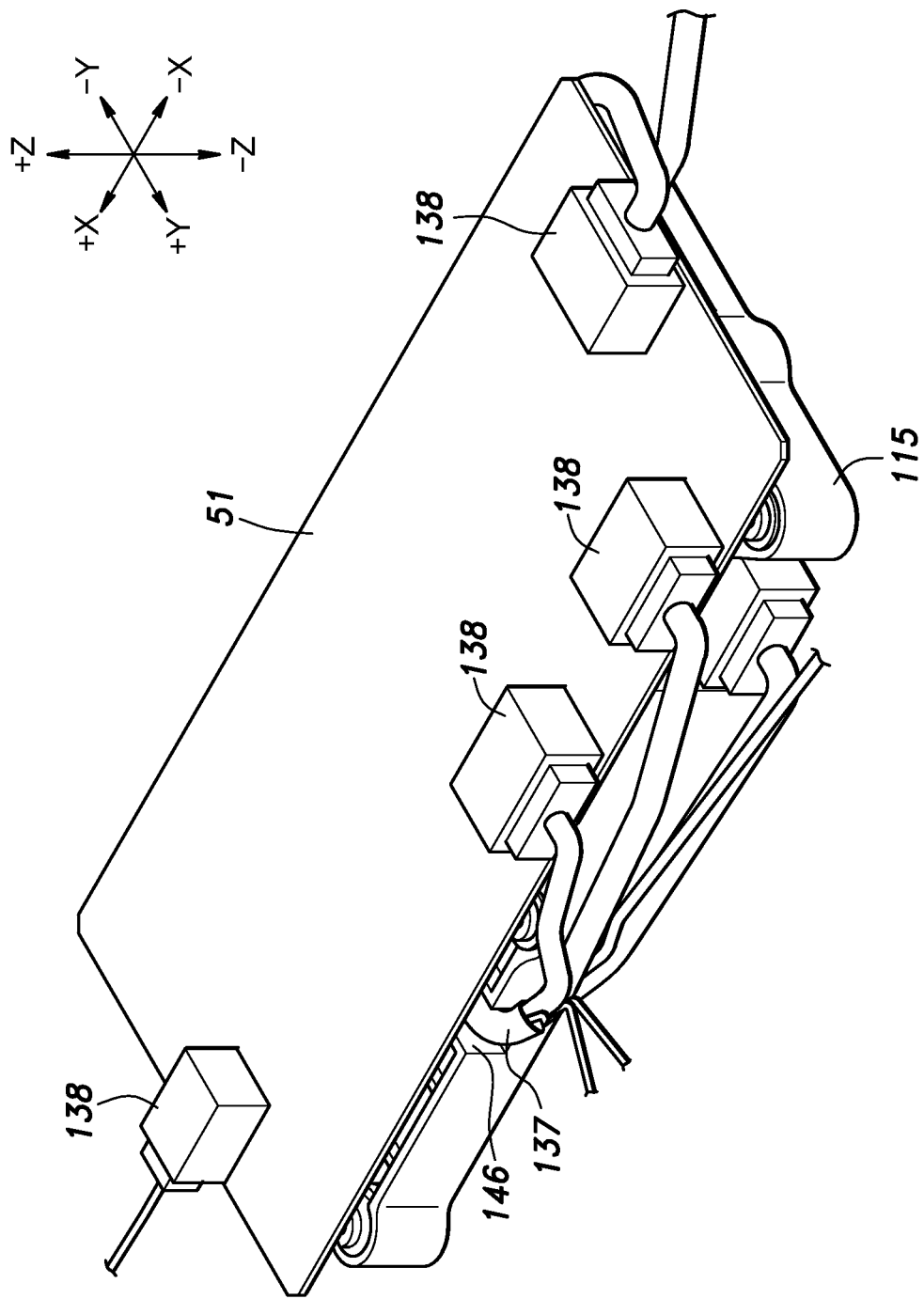

ELECTRIC POWER CONVERSION DEVICE

TECHNICAL FIELD

The present invention relates to an electric power conversion device.

BACKGROUND ART

In a known electric power converter device, a plurality of reactors, a power module, a capacitor and a control unit for controlling the power module are accommodated in a case. See JP2017-135901A, for instance. The control unit is connected to various sensors via signal lines, and controls the power module according to the detected signals from the sensors. The sensors may include a current sensor that detects electric current flowing through the reactor, a temperature sensor that detects the temperature of the reactor or the capacitor, and the like. The signal lines may also include those that connect the primary and secondary power lines to the control unit in order to detect voltages on the primary and secondary sides of the electric power conversion device.

Since a large number of signal lines are connected to the control unit, arranging these signal lines in a limited space in the case in an orderly manner involves highly laborious work. In addition, when clips are used for securing the signal lines in place, engagement features are required to be provided in the supporting members in the case in order for the clips to be installed, and this inevitably uses up a large amount of space in the case, creating the need to undesirably increase the size of the case.

SUMMARY OF THE INVENTION

In view of such a problem of the prior art, a primary object of the present invention is to provide an electric power conversion device which simplifies the wiring of signal lines connected to the control unit thereof, and minimizes the space required for wiring the signals lines.

The present invention achieves such an object by providing an electric power conversion device, comprising a control unit (51) configured to control a switching device (33) via a gate driver (52), and an electrically insulating support member (115) supporting the control unit, wherein the support member is provided with a first surface (116) supporting the control unit, and a second surface (117) facing away from the first surface, a signal line connected to the control unit extending along at least one of the first surface and the second surface.

Since the signal line is routed along one of the first surface and the second surface, the signal lines can be connected to the control unit at a plurality of different points so that the signal lines are prevented from being crowded in localized parts of the control unit.

Preferably, the switching device is placed on the second surface of the support member, and the signal line extends along the first surface.

Thereby, the signal line can be favorably routed by using a space created between the control unit and the support member while insulating the signal wire from the switching device so that the control unit, the support member, and the signal lines can be integrated at high density, and the size of the electric power conversion device can be minimized.

Preferably, the gate driver is placed on the second surface of the support member.

Thereby, the control unit and the gate driver can be arranged close to each other while being insulated by the support member. Thus, the control unit and the gate driver can be integrated at high density so that the size of the power converter can be minimized.

Preferably, the first surface of the support member is provided with reinforcing ribs (141), and the signal line is received in a receiving groove (142) formed between the adjacent reinforcing ribs.

Thereby, the signal line can be buried in the support member so that the signal line does not add to the thickness of the support member. Also, the receiving groove restricts the movement of the signal line so that the need for a clip to secure the signal line can be eliminated.

Preferably, an end of the receiving groove reaches an edge of the support member.

Thereby, the signal line can be passed into the receiving groove from an edge of the support member so that the support member and the control unit can be brought close to each other even further. This contributes to the minimization of the size of the electric power conversion unit.

Preferably, the receiving groove is provided with a cover that covers (151) at least a part of the signal line.

Since the signal line is retained by the cover, the position of the signal line is stabilized.

Preferably, the receiving groove includes at least one curved portion.

Owing to this arrangement, the bending stiffness of the support member can be improved. If the receiving groove extended simply linearly, a weak part without any reinforcing rib would be arranged in a straight line so that the support member would be prone to bending deformation along the receiving groove. By bending the receiving groove, the weakened part is prevented from lining up so that the bending stiffness of the support member can be improved.

Preferably, a power module is formed by covering the switching device with mold resin, and the gate driver is connected to an outer side of the power module, the power module being connected to the support member.

Thereby, the control unit, the support member, the gate driver, and the power module can be formed as an integral unit.

Preferably, the electric power conversion device further comprises a case forming an outer shell of the electric power conversion device, and a support plate (88) connected to an inner side of the case, the support plate internally defining a flow passage (91) in which a cooling medium circulates, and the power module being connected to the support plate.

Thereby, the control unit, the support member, the gate driver, and the power module can be supported by the case via the support plate. Also, the power module can be cooled by the cooling medium circulating in the flow passage in the support plate.

Preferably, the electric power conversion device further comprises a capacitor placed on a surface of the support plate facing away from the power module.

Thereby, the control unit, the support member, the gate driver, and the power module can be formed as a compact unit.

Preferably, the signal line comprises a signal line (133L) connecting a temperature sensor (133L) for detecting a temperature of the capacitor (35) to the control unit. Preferably, the signal line comprises a signal line (127L) connecting a first current sensor (48) for detecting an electric current of a power line (127) of a primary side of the electric power conversion device to the control unit. Preferably, the signal line comprises a signal line (49L) connecting a second current sensor (49) for detecting an electric current of a reactor (15) to the control unit. Preferably, the signal line comprises a signal line (131L, 132L) connecting a temperature sensor (131, 132) for detecting a temperature of a reactor (15) to the control unit. Preferably, the signal line comprises a signal line (121L, 126L) connecting a power line of a primary side or a secondary side of the electric power conversion device to the control unit.

The invention thus provides an electric power conversion device which simplifies the wiring of signal lines connected to the control unit thereof, and minimizes the space required for wiring the signals lines.

BRIEF DESCRIPTION OF THE DRAWING(S)

FIG. 11 is a perspective view of the support member; and

FIG. 12 is a perspective view of the support member and the converter ECU.

DESCRIPTION OF THE PREFERRED EMBODIMENT(S)

An electric vehicle according to an embodiment of the present invention is described in the following.

Figure 1:
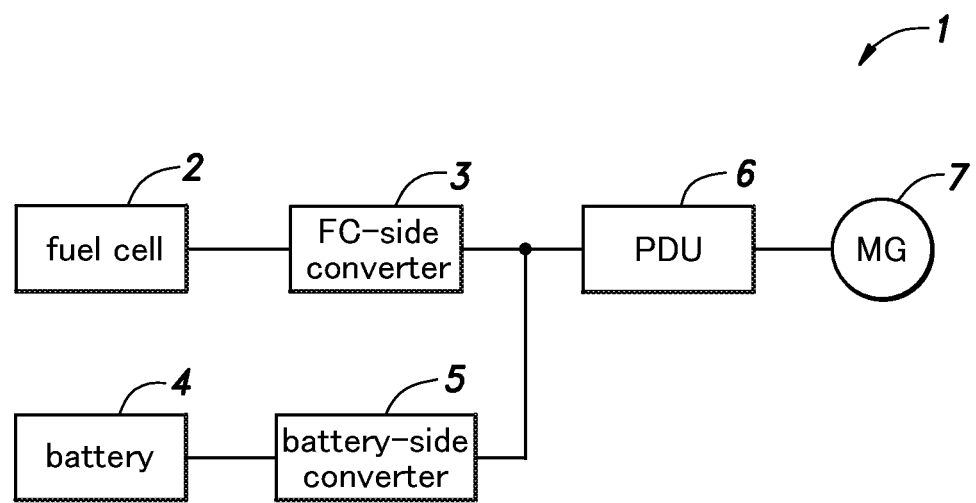
FIG. 1 is a block diagram of an electric vehicle according to an embodiment of the present invention.
Figure 2:
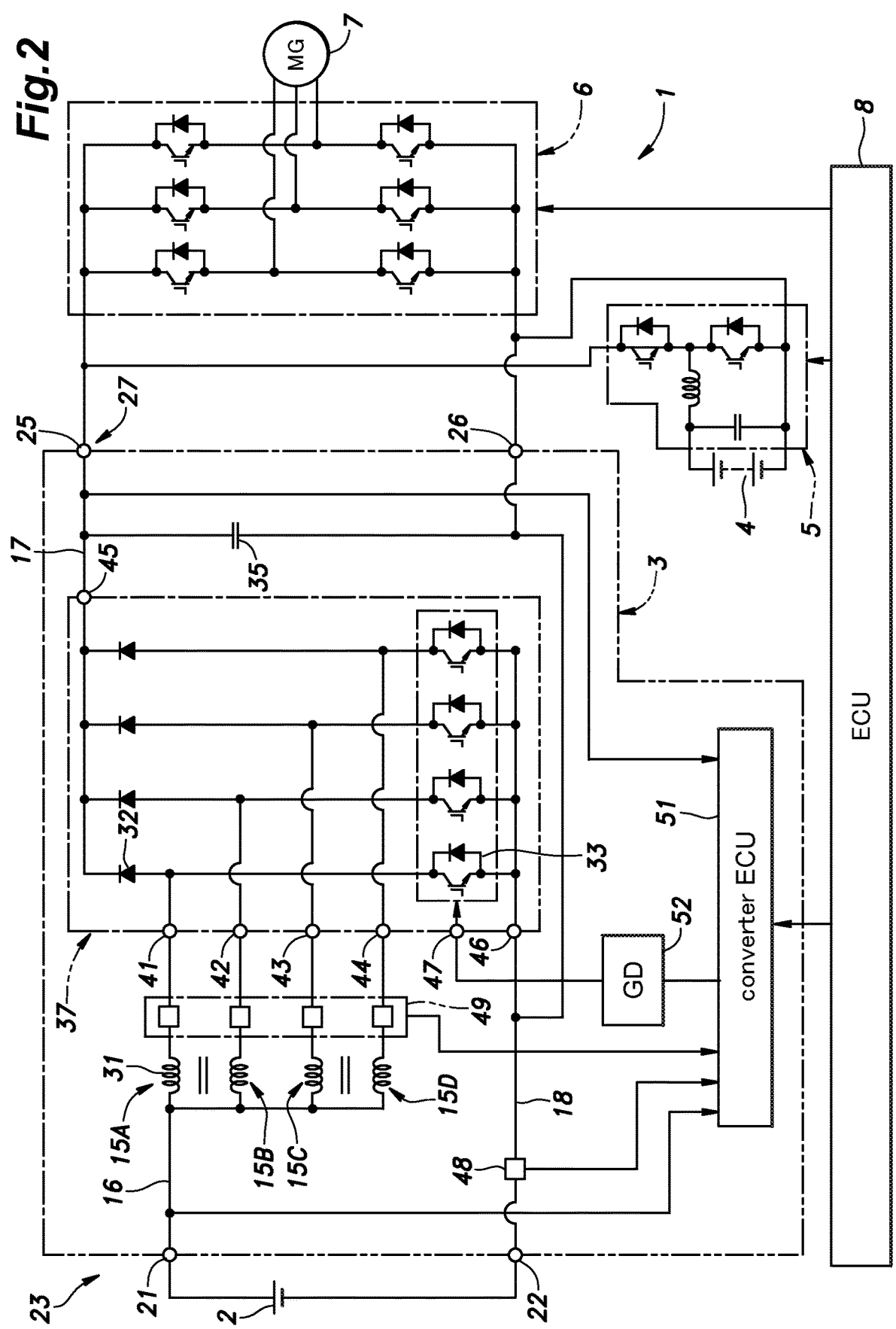
FIG. 2 is an electric circuit diagram of the electric vehicle.

As shown in FIG. 1, the electric vehicle 1 includes a fuel cell 2 (FC), an FC-side converter 3 (electric power conversion device), a battery 4, a battery-side converter 5, a PDU 6 (Power Drive Unit), and a motor generator 7. The FC-side converter 3 and the battery-side converter 5 each consist of a DC/DC converter, and the PDU 6 consists of an inverter. The FC-side converter 3, the battery-side converter 5, and the PDU 6 are controlled by an ECU 8 (FIG. 2).

The fuel cell 2 generates electric energy by chemical reaction using hydrogen and oxygen as raw materials. The electric power generated by the fuel cell 2 is supplied to the motor generator 7 via the FC-side converter 3 and the PDU 6, and supplied to the battery 4 via the FC-side converter 3 and the battery-side converter 5. The power of the battery 4 is supplied to the motor generator 7 via the battery-side converter 5 and the PDU 6.

The motor generator 7 is a power source for propelling the electric vehicle 1, and receives power supply from at least one of the power supply device and the battery 4 to drive the drive wheels of the electric vehicle 1. When the electric vehicle 1 decelerates, the motor generator 7 operates as a generator so as to apply a braking force to the drive wheels, and generate regenerative electric power. The regenerative power is supplied to the battery 4 via the PDU 6 and the battery-side converter 5.

The electric circuit of the FC-side converter 3 is described in the following with reference to FIG. 2. As shown in FIG. 2, the FC-side converter 3 is a multiphase converter including a plurality of voltage converters 15 that are connected in parallel to one another. More specifically, the FC-side converter 3 includes a primary side positive line 16, a secondary side positive line 17, a negative line 18, and first to fourth voltage converters 15A to 15D connected between the primary side positive line 16 and the secondary side positive line 17. Each element of the first voltage converter 15A is indicated by a suffix A, each element of the second voltage converter 15B is indicated by a suffix B, and each element of the third voltage converter 15C is indicated by a suffix C, and each element of the fourth voltage converter 15D is indicated by a suffix D. When various elements of the first to fourth voltage converters 15A to 15D are collectively referred to, the suffixes are omitted.

A terminal end of the primary side positive line 16 is provided with a primary side positive terminal 21, and a terminal end of the negative line 18 is provided with a primary side negative terminal 22. The primary side positive terminal 21 and the primary side negative terminal 22 jointly form a primary side connection portion 23, and are connected to a positive pole and a negative pole of the fuel cell 2, respectively. A terminal end of the secondary side positive line 17 is provided with a secondary side positive terminal 25. The other terminal end of the negative line 18 is provided with a secondary side negative terminal 26. The secondary side positive terminal 25 and the secondary side negative terminal 26 jointly form a secondary side connection portion 27 which is connected to the PDU 6 and the battery-side converter 5.

The first to fourth voltage converters 15A to 15D are each provided with a reactor 31 and a diode 32 which are connected in series in the power line extending between the primary side positive line 16 and the secondary side positive line 17 in that order from the side of the primary side positive line 16, and a switching device 33 connected between the node between the reactor 31 and the diode 32 and the negative line 18. Thus a step-up chopper circuit is formed. A secondary side capacitor 35 (smoothing capacitor) is connected between the negative line 18 and the secondary side positive line 17.

All the diodes 32 and the switching devices 33 included in the first to fourth voltage converters 15A to 15D are integrated as a single power module 37 (switching unit). The power module 37 includes a circuit board supporting the diodes 32 and the switching devices 33, and a molding resin which covers the diodes 32 and the switching devices 33 to define the outer shape of the power module 37. The power module 37 includes a first positive terminal 41 serving as a primary side positive terminal of the first voltage converter 15A, a second positive terminal 42 serving as a primary side positive terminal corresponding to the second voltage converter 15B, a third positive terminal 43 serving as a primary side positive terminal corresponding to the third voltage converter 15C, a fourth positive terminal 44 serving as a primary side positive terminal corresponding to the fourth voltage converter 15D, a fifth positive terminal 45 serving as a secondary side positive terminal, and a negative terminal 46 connected to the negative line 18. The power module 37 also has a drive signal terminal 47 configured to receive a drive signal for each switching device 33. The drive signal terminal 47 includes a plurality of terminal pieces corresponding to the respective switching devices 33.

The negative line 18 is provided with a first current sensor 48, and the power lines of the voltage converter 15 for different phases are each provided with a second current sensor 49 for detecting the current of the corresponding phase. The first current sensor 48 and the second current sensor 49 each consist of a Hall sensor that is not in electrical contact with the circuit to be detected.

The FC-side converter 3 has a converter ECU 51 (control unit) that controls the on/off of each switching device 33 in response to a signal from the ECU 8. The converter ECU 51 forwards a control signal to each switching device 33 via a gate driver 52. More specifically, the gate driver 52 forwards a drive signal corresponding to the control signal output from the converter ECU 51 to each switching device 33 to drive each switching device 33 accordingly.

Each voltage converter 15 boosts the voltage by turning on and off the switching device 33 according to the signal from the converter ECU 51, and supplies the boosted voltage to the secondary side. The converter ECU 51 determines the number of power converters to be driven, and the on/off phase and the duty ratio of each switching device 33 according to the signal from ECU 8 and the signals from first current sensor 48 and second current sensor 49.

Figure 3:
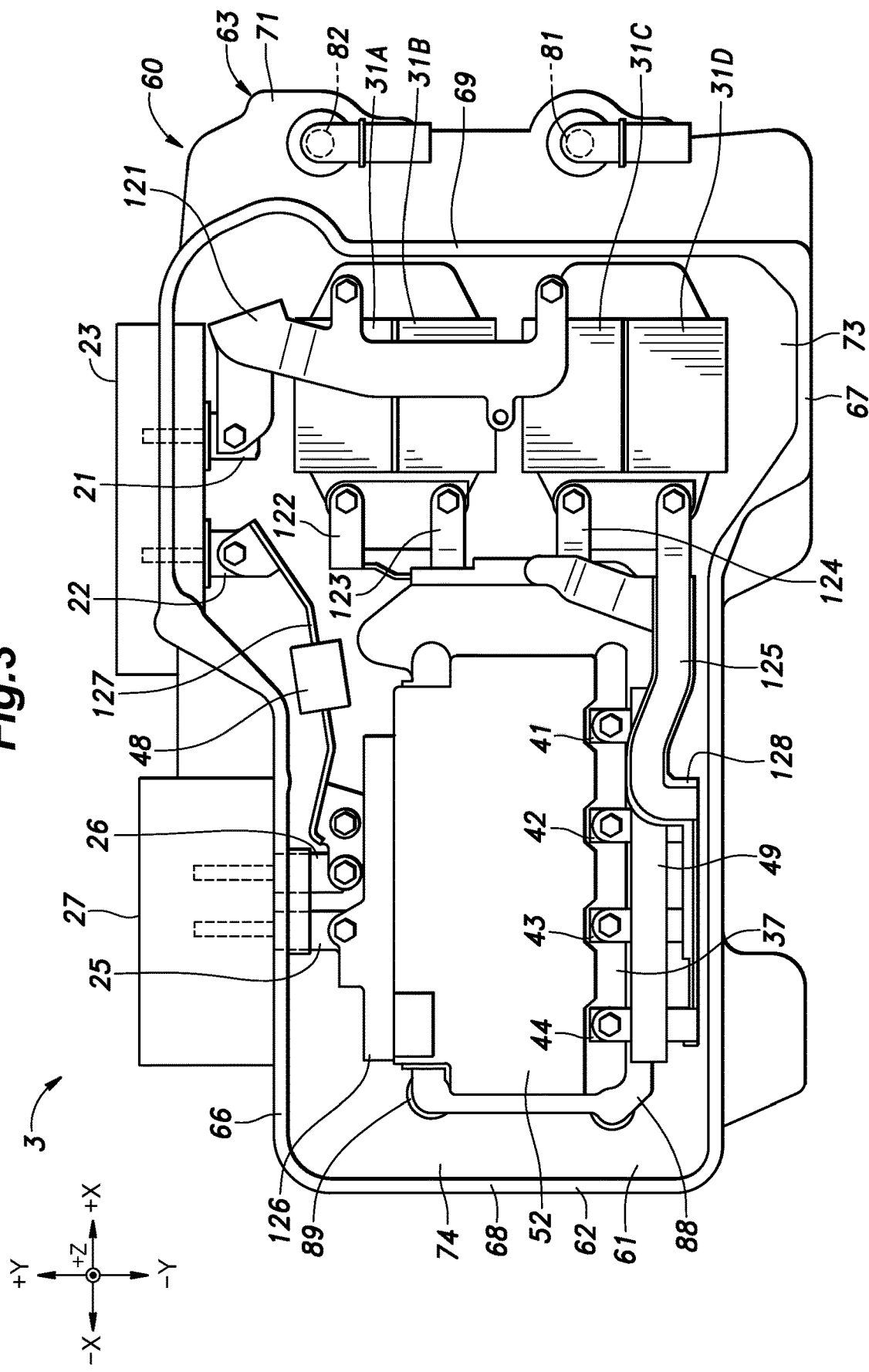
FIG. 3 is a plan view of an FC-side converter with an upper case, a converter ECU and a support member omitted from illustration.
Figure 4:
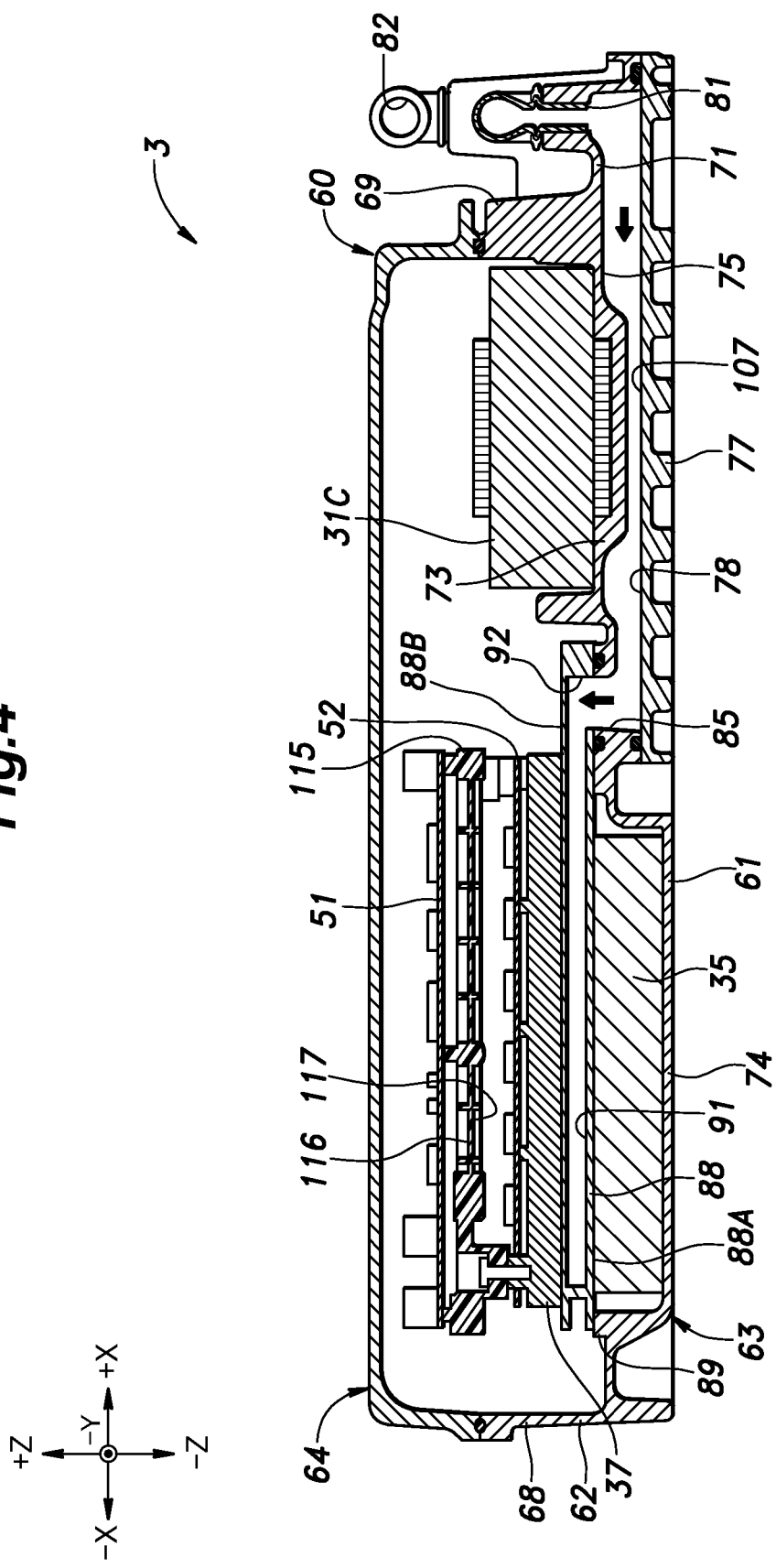
FIG. 4 is a vertical sectional view of the FC-side converter.

Next, the structure of the FC-side converter 3 is described in the following with reference to FIGS. 3 to 12. As shown in FIGS. 3 and 4, the outer shell of the FC-side converter 3 is formed by a case 60. The case 60 has a box-shaped first case 63 including a bottom 61 (first member, mounting portion) consisting of a flat plate and a side wall 62 extending upright from the periphery of the bottom 61 at right angle, and a plate-like second case 64 attached to the free end of the side wall 62 to define a receiving space in cooperation with the first case 63. In the following description regarding the FC-side converter 3, the various directions are defined with respect to the case 60. The direction orthogonal to the bottom 61 is the Z direction (the vertical direction as mounted on the vehicle), the direction toward the second case 64 with respect to the bottom 61 is +Z, and the direction facing away from the +Z is −Z. A first direction orthogonal to the Z direction is defined as X direction (the lateral direction as mounted on the vehicle), and a second direction orthogonal to both the Z direction and the X direction is defined as the Y direction (the fore and aft direction as mounted on the vehicle). The X direction may be +X or −X depending on which way the direction is defined along the X direction. Likewise, the Y direction may be +Y or −Y depending on which way the direction is defined along the Y direction. The case may be made of metallic material such as aluminum.

The bottom 61 is formed in a substantially rectangular shape extending along a plane including the X direction and the Y direction, and having a greater width in the X direction than in the Y direction. The side wall 62 includes first and second side walls 66 and 67 extending in the X direction, and third and fourth side walls 68 and 69 extending in the Y direction. The first side wall 66 is disposed on the +Y side with respect to the second side wall 67, and the third side wall 68 is disposed on the −X side with respect to the fourth side wall 69. The first side wall 66, the second side wall 67, the third side wall 68, and the fourth side wall 69 are connected to each other to form a frame, and are provided around the periphery of the bottom 61. The fourth side wall 69 is disposed at a position offset inward with respect to the side edge of the bottom 61 on the +X side. A part of the bottom 61 that protrudes beyond the fourth side wall 69 on the +X side will be referred to as extension 71.

Figure 6:
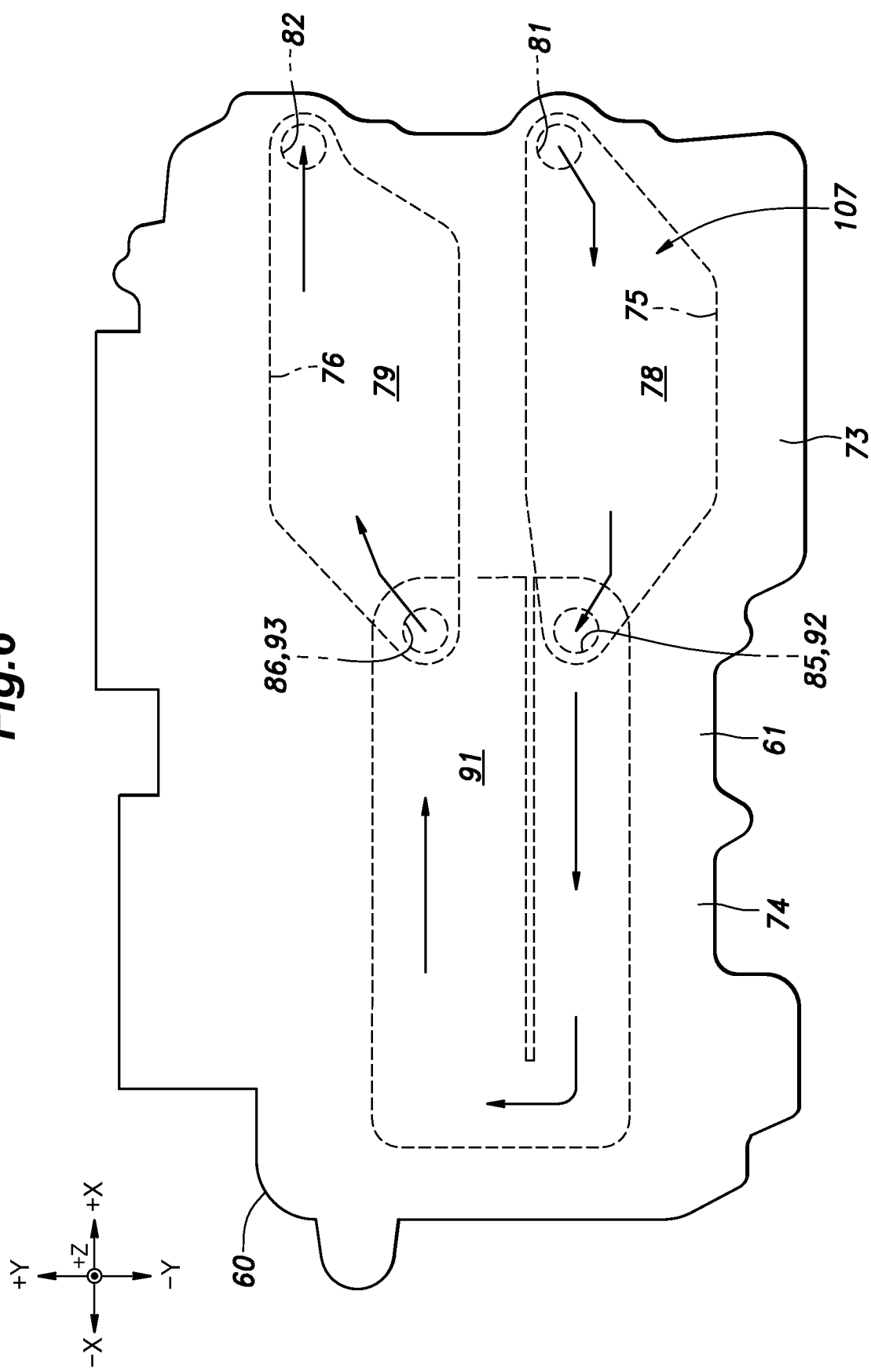
FIG. 6 is a diagram showing a medium passage of the FC-side converter.

The bottom 61 may be divided into a first region 73 located on the +X side, and a second region 74 located on the −X side. The extension 71 is included in the first region 73. As shown in FIG. 4, the inner surface of the second region 74 is offset from the inner surface of the first region 73 in the outward direction (−Z side) in a step-wise manner. As shown in FIGS. 4 and 6, the outer surface of the first region 73 of the bottom 61 is formed with a first recess 75 and a second recess 76 which are recessed inward. The first recess 75 and the second recess 76 extend in the X direction, and the second recess 76 is disposed on the +Y side of the first recess 75. The first recess 75 and the second recess 76 extend along the −Z side of the fourth side wall 69, and the end parts of these recesses on the +X side are disposed in the extension 71. The first recess 75 and the second recess 76 have a certain width in the Y direction.

To the outer surface of the first region 73 of the bottom 61 is secured an outer plate member 77 via a gasket so as to close the open ends of the first recess 75 and the second recess 76. The outer plate member 77 defines an upstream first passage 78 in cooperation with the first recess 75, and a downstream first passage 79 in cooperation with the second recess 76. The upstream first passage 78 and the downstream first passage 79 are separated from each other. The outer plate member 77 is provided with a plurality of ribs on an outer surface (facing the −Z side) so as to enhance the cooling of the cooling medium through the first passage. Also, the second region 74 of the bottom 61 is planar in this embodiment, and the outer surface of the outer plate member 77 is substantially flush with the outer surface of second region 74 so that the case 60 may be provided with a simple profile such a rectangular parallelepiped outer profile. The extension 71 of the bottom 61 is provided with an inlet hole 81 (cooling medium inlet) that is passed through from the first recess 75 to the surface of the extension 71 facing the +Z direction, and an outlet hole 82 (cooling medium outlet) passed through from the second recess 76 to the inwardly facing surface of the bottom 61.

Figure 5:
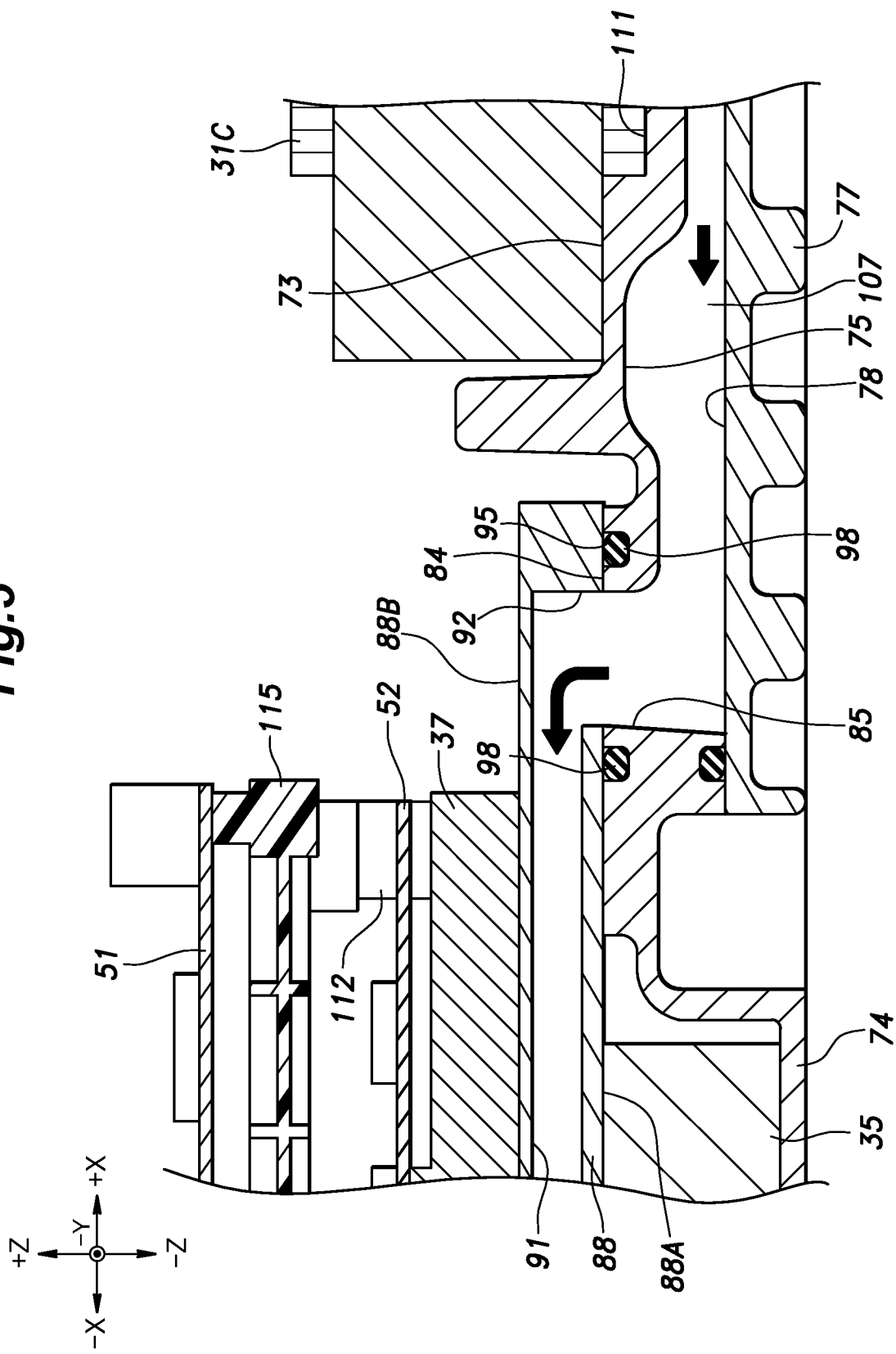
FIG. 5 is an enlarged vertical sectional view of an essential part of the FC-side converter.

As shown in FIG. 5, on the −X side of the inner surface of the first region 73, a planar fastening surface 84 is formed. In the first region 73, a first communication hole 85 is passed from the first recess 75 through the fastening surface 84, and a second communication hole 86 is passed from the second recess 76 through the fastening surface 84. The second communication hole 86 is disposed on the +Y side of the first communication hole 85.

As shown in FIGS. 3 and 4, to the fastening surface 84 of the first region 73 is fastened a support plate 88 (second member; inner plate member) which is formed as a plate member having a first surface 88A (surface facing the −Z side) facing the bottom 61, and a second surface 88B (surface facing the +Z side) facing away from the bottom 61. The support plate 88 is fastened to the fastening surface 84 at the end part of the first surface 88A on the +X side. The support plate 88 is disposed so as to overlap with the first region 73 in the end part thereof on the +X side, and overlaps with the second region 74 in the remaining part thereof. The support plate 88 opposes the inner surface of the second region 74 in a spaced apart and parallel relationship. The end part of the support plate 88 on the −X side is supported by a projection 89 projecting from the inner surface of the second region 74 toward the +Z side. The end part of the support plate 88 on the −X side may be fastened to the projection 89.

The support plate 88 is internally formed with a second passage 91. As shown in FIGS. 4 to 6, the second passage 91 is provided with a third communication hole 92 opening at an end part of the first surface 88A of the support plate 88 on the +X side to communicate with the first communication hole 85, and a fourth communication hole 93 opened at an end part of the first surface 88A on the +X side to communicate with the second communication hole 86. The fourth communication hole 93 is disposed on the +Y side of the third communication hole 92. The second passage 91 extends from the third communication hole 92 to the end part of the support plate 88 on the −X side, and bent back to the +Y side and the +X side before extending to the end part of the support plate 88 on the +X side to be connected to the fourth communication hole 93.

As shown in FIG. 5, a pair of annular seal grooves 95 are formed in the fastening surface 84 of the first region 73 so as to surround the first communication hole 85 and the second communication hole 86, respectively. Each seal groove 95 is provided with a gasket 98 for sealing the connecting part between the first communication hole 85 and the third communication hole 92 or the connecting part between the second communication hole 86 and the fourth communication hole 93. Each gasket 98 is formed of flexible rubber, and is formed in an annular shape so to extend along the corresponding seal groove 95.

The upstream first passage 78, the second passage 91, and the downstream first passage 79 form a medium passage 107 through which the cooling medium flows. The cooling medium may, for example, be water. The inlet hole 81 and the outlet hole 82 are connected to a circulation circuit of the cooling medium via a hose or the like in such a manner that the inlet hole 81 receives a supply of the cooling medium from the circulation circuit, and the outlet hole 82 discharges the cooling medium to the circulation circuit. Thereby, as shown in FIG. 6, the cooling medium flows through the inlet hole 81, the upstream first passage 78, the first communication hole 85, the fourth communication hole 93, the second passage 91, the fourth communication hole 93, the second communication hole 86, the downstream first passage 79, and the outlet hole 82, in that order. As shown in FIG. 4, the second passage 91 is offset from the upstream first passage 78 and the downstream first passage 79 on the +Z side.

As shown in FIG. 3, in the first region 73, the first to fourth reactors 31A to 31D are arranged in such a manner that the reactors 31A to 31D are arranged side by side in the Y direction with the axial lines thereof extending in the X direction. The first to fourth reactors 31A to 31D are arranged in ascending order from the +Y side to the −Y side. The first and second reactors 31A and 31B have a common ring-shaped core, and the third and fourth reactors 31C and 31D have a common ring-shaped core.

As shown in FIG. 4, each of the reactors 31A to 31D is in contact with the inner surface of the first region 73 of the bottom 61. The inner surface of the first region 73 is formed with a receiving recess 111 in which the reactors 31A to 31D are snugly received so that the contact area between each of the reactors 31A to 31D and the inner surface of the first region 73 of the bottom 61 is maximized, and the heat transfer from the reactors 31A to 31D to the first region 73 of the bottom 61 is maximized.

The secondary side capacitor 35 (smoothing capacitor) is provided on the first surface 88A of the support plate 88. The secondary side capacitor 35 is formed in a flat plate shape, and is in contact with the first surface 88A of the support plate 88. Further, the secondary side capacitor 35 is in contact with the inner surface of the second region 74 of the bottom 61 at the surface thereof facing away from the support plate 88. In other words, the secondary side capacitor 35 is disposed in the space defined between the first surface 88A of the support plate 88 and the inner surface of the second region 74, and is in contact with both the support plate 88 and the second region 74. The secondary side capacitor 35 is preferably in surface contact with the support plate 88 and the second region 74.

The power module 37 is formed in a flat rectangular parallelepiped shape, and is placed on and fastened to the second surface 88B of the support plate 88. The power module 37 is preferably in surface contact with the second surface 88B of the support plate 88. In the power module 37, the first to fourth switching devices 33A to 33D are arranged side by side in the X direction. Specifically, the first switching device 33A, the second switching device 33B, the third switching device 33C, and the fourth switching device 33D are disposed in that order from the +X side to the −X side. Thus, the power module 37 is formed so as to be larger in width in the X direction than in the Y direction. The power module 37 is disposed on the −X side of the reactors 31. Preferably, the side edge of the power module 37 on the +Y side is located on the −Y side of the side edge of the first reactor 31A on the +Y side, and the side edge of the power module 37 on the −Y side is located on the +Y side of the side edge of the first reactor 31A on the −Y side. In other words, the power module 37 is disposed so as to overlap with the reactors 31 when viewed in the X direction.

The edge of the power module 37 on the −Y side is provided with a first positive terminal 41, a second positive terminal 42, a third positive terminal 43, and a fourth positive terminal 44, in that order from the +X side. The edge of the power module 37 on the +Y side is provided with a negative terminal 46 and a fifth positive terminal 45, in that order from the +X side to the −X side.

On the surface of the power module 37 facing in the +X direction and defined by the mold resin is placed a gate driver 52 which consists of a flat electronic component formed of a printed circuit board and electronic devices to function as a gate drive circuit. The gate driver 52 is fastened to the power module 37. The power module 37 and the gate driver 52 that are connected to each other jointly form an IPM (Intelligent Power Module). A plurality of pillars 112 project to the +Z side from the periphery of the surface of the power module 37 on the +Z side so as not to interfere with the gate driver 52. Each pillar 112 extends in the +Z direction beyond the gate driver 52.

A support member 115 for supporting the converter ECU 51 is disposed on the +Z side of the gate driver 52. The support member 115 is formed of an insulating resin material. The support member 115 is formed in a plate shape having a first surface 116 facing the +Z side and a second surface 117 facing the −Z side (a surface facing the bottom 61). The support member 115 is fastened to the tip ends of the pillars 112 so that a clearance is defined between the second surface 117 of the support member 115 and the gate driver 52 owing to these pillars 112.

The converter ECU 51 is a flat plate-shaped electronic control unit (ECU) formed of a printed circuit board and devices mounted thereof. The converter ECU 51 is fastened to the upper surface of support member 115 such that the outer surface thereof faces in the +Z direction.

The secondary side capacitor 35, the support plate 88, the power module 37, the gate driver 52, the support member 115, and the converter ECU 51 are stacked one over another in the Z direction in a +Z side part of the second region 74 of the bottom 61.

Figure 8:
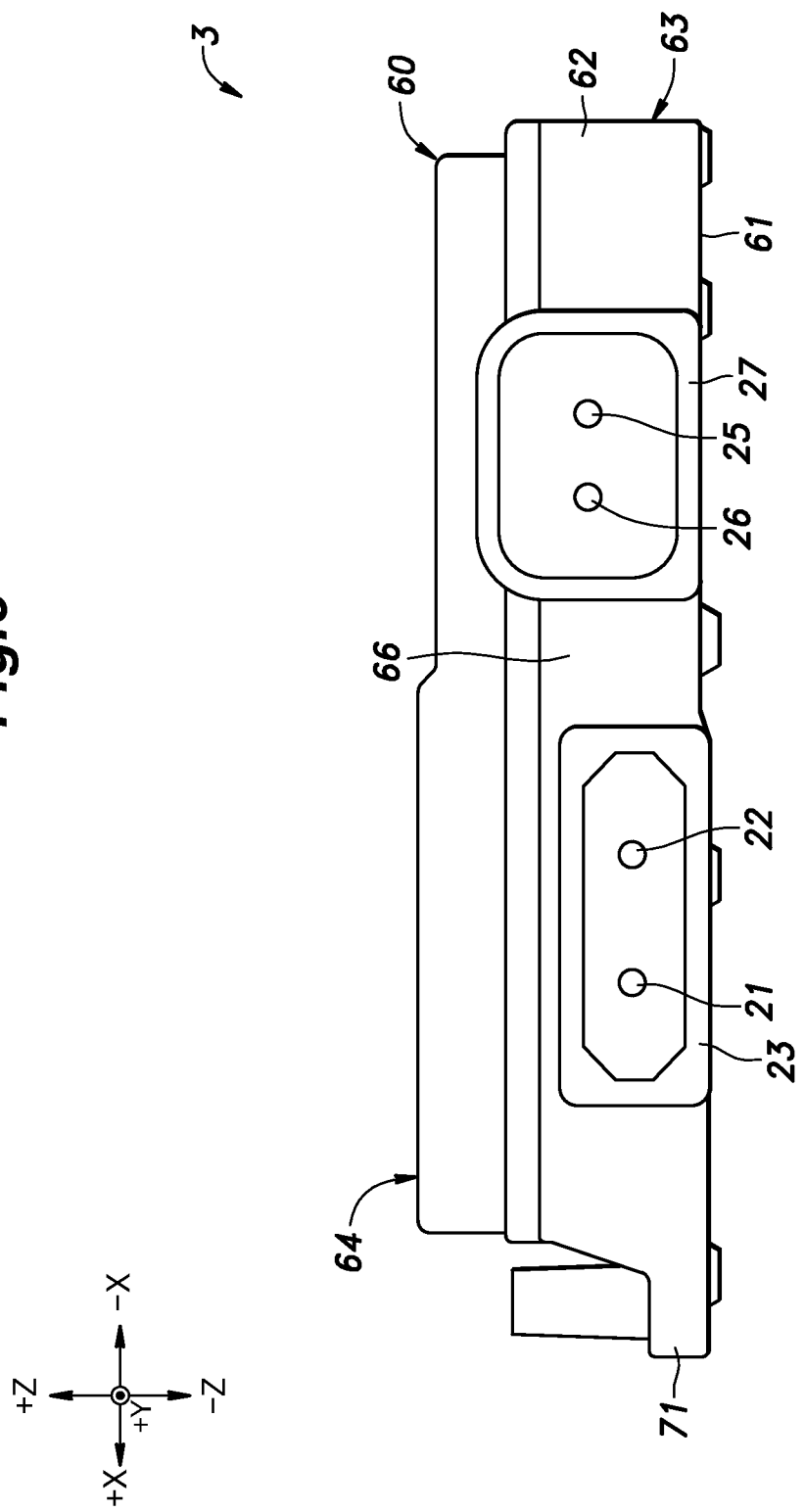
FIG. 8 is a side view of the FC-side converter as viewed from the +Y side.

As shown in FIGS. 3 and 8, the primary side connection portion 23 is provided on the +X side of the outer surface of the first side wall 66, and the secondary side connection portion 27 is provided on the −X side. Each of the primary side connection portion 23 and the secondary side connection portion 27 is formed in a cylindrical shape opening out toward the +Y side. The primary side connection portion 23 is provided on the +Y side of the reactors 31, and the secondary side connection portion 27 is provided on the +Y side of the power module 37.

The primary side positive terminal 21 and the primary side negative terminal 22 are provided inside the primary side connection portion 23. The primary side positive terminal 21 is disposed on the +X side of the primary side negative terminal 22. The secondary side positive terminal 25 and the secondary side negative terminal 26 are provided inside the secondary side connection portion 27. The secondary side negative terminal 26 is disposed on the +X side of the secondary side positive terminal 25. In other words, the primary side positive terminal 21, the primary side negative terminal 22, the secondary side negative terminal 26, and the secondary side positive terminal 25 are arranged on the first side wall 66 in that order from the +X side to the −X side. The primary side positive terminal 21, the primary side negative terminal 22, the secondary side negative terminal 26, and the secondary side positive terminal 25 are each formed in a pin shape. In another embodiment, the primary side positive terminal 21, the primary side negative terminal 22, the secondary side negative terminal 26, and the secondary side positive terminal 25 are each formed in a tubular shape so as to receive a pin-like counterpart terminal.

Figure 9:
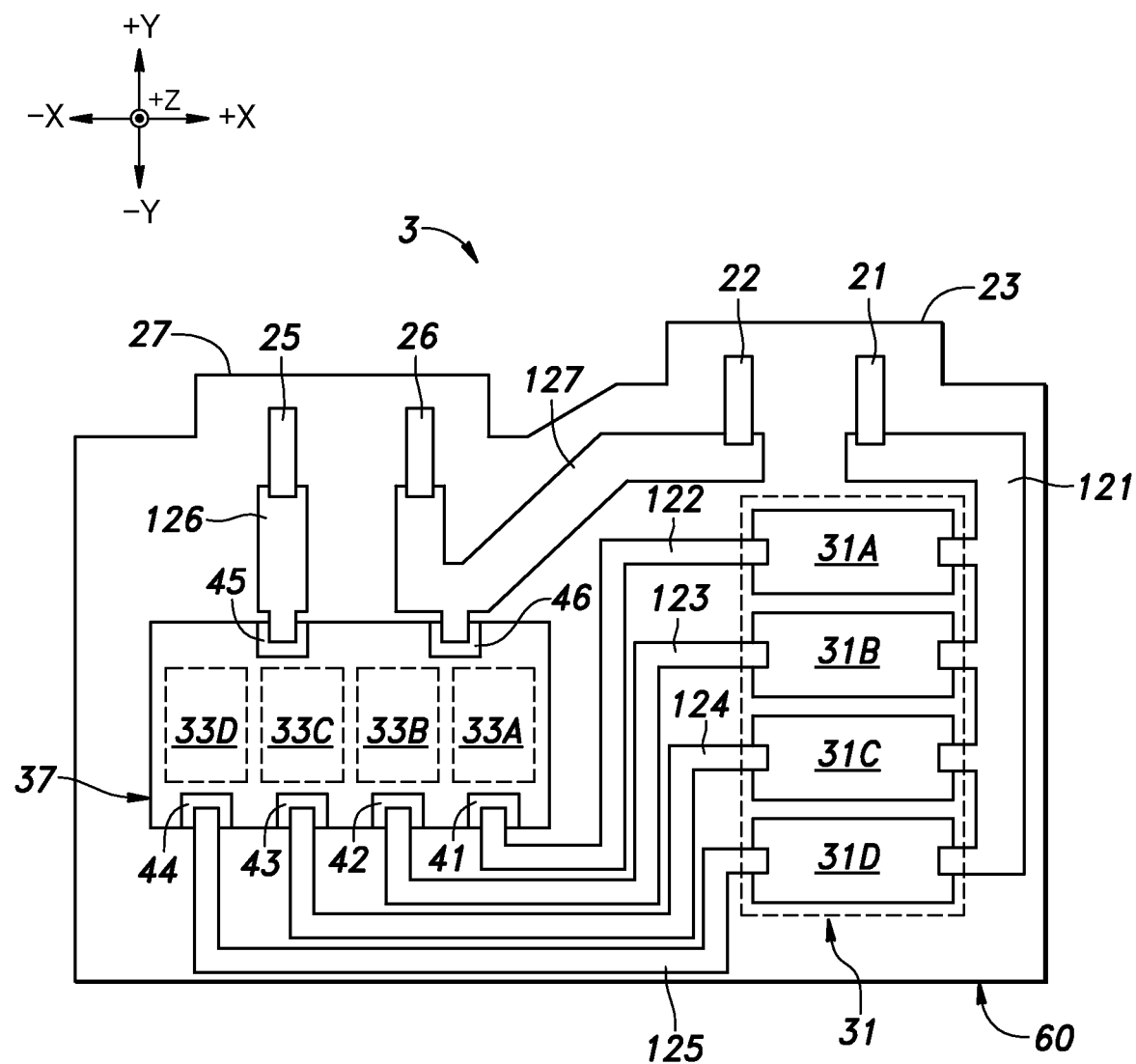
FIG. 9 is a diagram showing a layout of various elements of the FC-side converter.

As shown in FIGS. 3 and 9, the first to fourth reactors 31A to 31D each have a primary side end on the +X side, and a secondary side end on the −X side, with respect to the X direction. The primary side positive terminal 21 is connected to the primary side ends of the first to fourth reactors 31A to 31D via a first positive bus bar 121 which is branched in a corresponding manner. The primary side positive line 16 is formed by the first positive bus bar 121. The first positive bus bar 121 extends from the primary side positive line 16 in the −Y direction, and branches so as to be connected to the primary side ends of the first to fourth reactors 31A to 31D at the branched ends thereof. A part of the first positive bus bar 121 may be disposed so as to overlap with the first to fourth reactors 31A to 31D when viewed from the Z direction.

The secondary side end of the first reactor 31A is connected to the first positive terminal 41 of the power module 37 via a second positive bus bar 122. The secondary side end of the second reactor 31B is connected to the second positive terminal 42 of the power module 37 via a third positive bus bar 123. The secondary side end of the third reactor 31C is connected to the third positive terminal 43 of the power module 37 via a fourth positive bus bar 124. The secondary side end of the fourth reactor 31D is connected to the fourth positive terminal 44 of the power module 37 via a fifth positive bus bar 125. The second to fifth positive bus bars 122 to 125 are separated from one another by insulating material 128. The second to fifth positive bus bars 122 to 125 extend from the secondary side ends of the reactors 31A to 31D in the −Y direction, and then extend in the −X direction to be connected to the corresponding positive terminals 41 to 44.

The fifth positive terminal 45 of the power module 37 is connected to the secondary side positive terminal 25 via a sixth positive bus bar 126 which extends from the fifth positive terminal 45 in the +Y direction to be connected to the secondary side positive terminal 25.

The primary side negative terminal 22 is connected to the secondary side negative terminal 26 and the negative terminal 46 of the power module 37 via a branched negative bus bar 127. The negative line 18 is formed by the negative bus bar 127. The negative bus bar 127 extends from the primary side negative terminal 22 to the −X side and the −Y side to be connected to the negative terminal 46, and branches from a lengthwise intermediate point thereof to extend in the +Y direction therefrom to be connected to the secondary side negative terminal 26.

Figure 7:
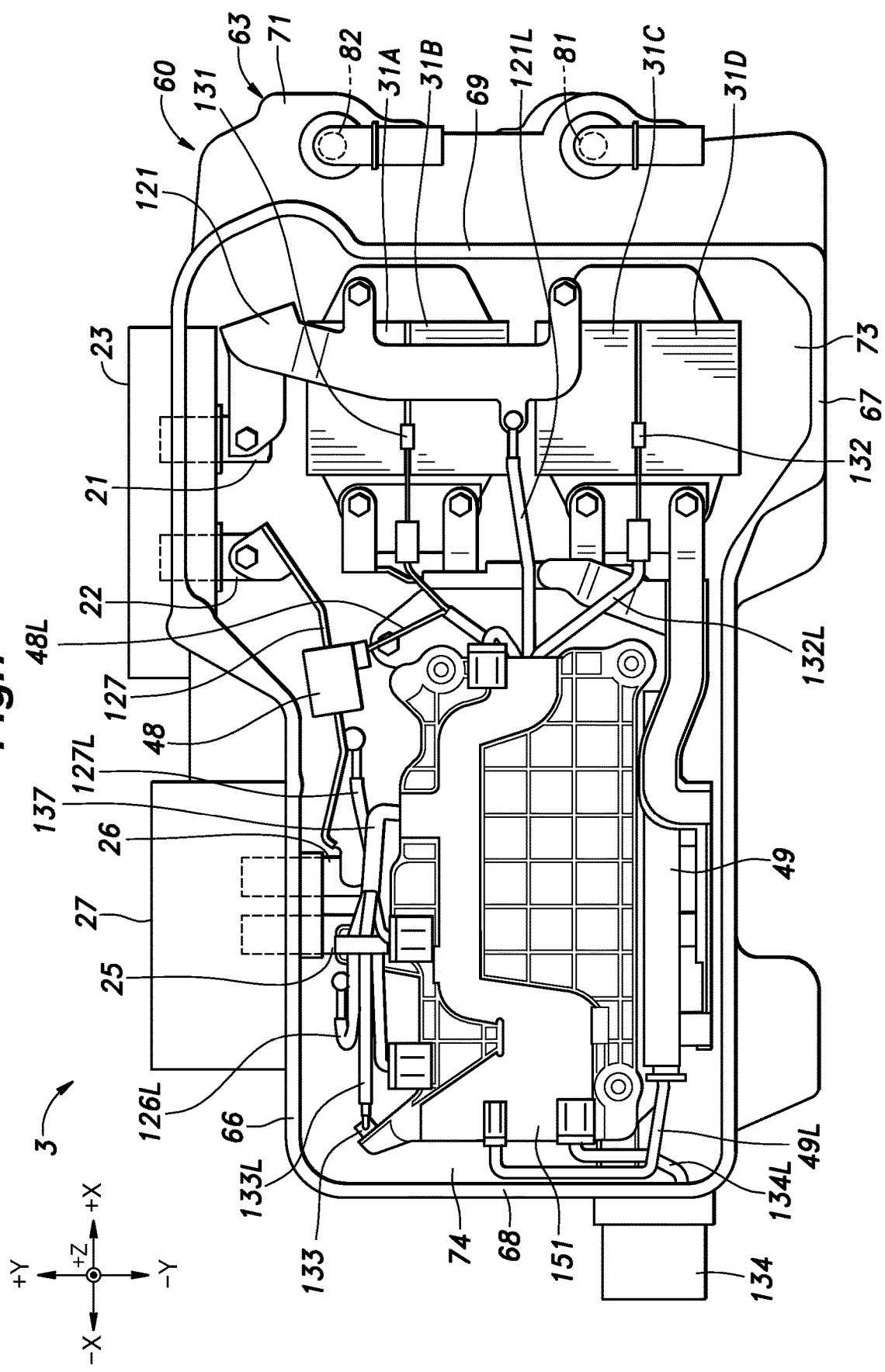
FIG. 7 is a plan view of the FC-side converter with the upper case and the converter ECU omitted from illustration.

The first current sensor 48 is provided on the negative bus bar 127. The second current sensor 49 is provided on the second to fifth positive bus bars 122 to 125. The second current sensor 49 is disposed behind the power module 37. As shown in FIG. 7, a first reactor temperature sensor 131 is provided between the first reactor 31A and the second reactor 31B to detect the temperature of the first reactor 31A and the second reactor 31B. A second reactor temperature sensor 132 is provided between the third reactor 31C and the fourth reactor 31D to detect the temperature of the third reactor 31C and the fourth reactor 31D. In addition, a capacitor temperature sensor 133 is provided on the secondary side capacitor 35 to detect the temperature of the secondary side capacitor 35. The third side wall 68 is provided with a connector 134 for external connection.

Figure 10:
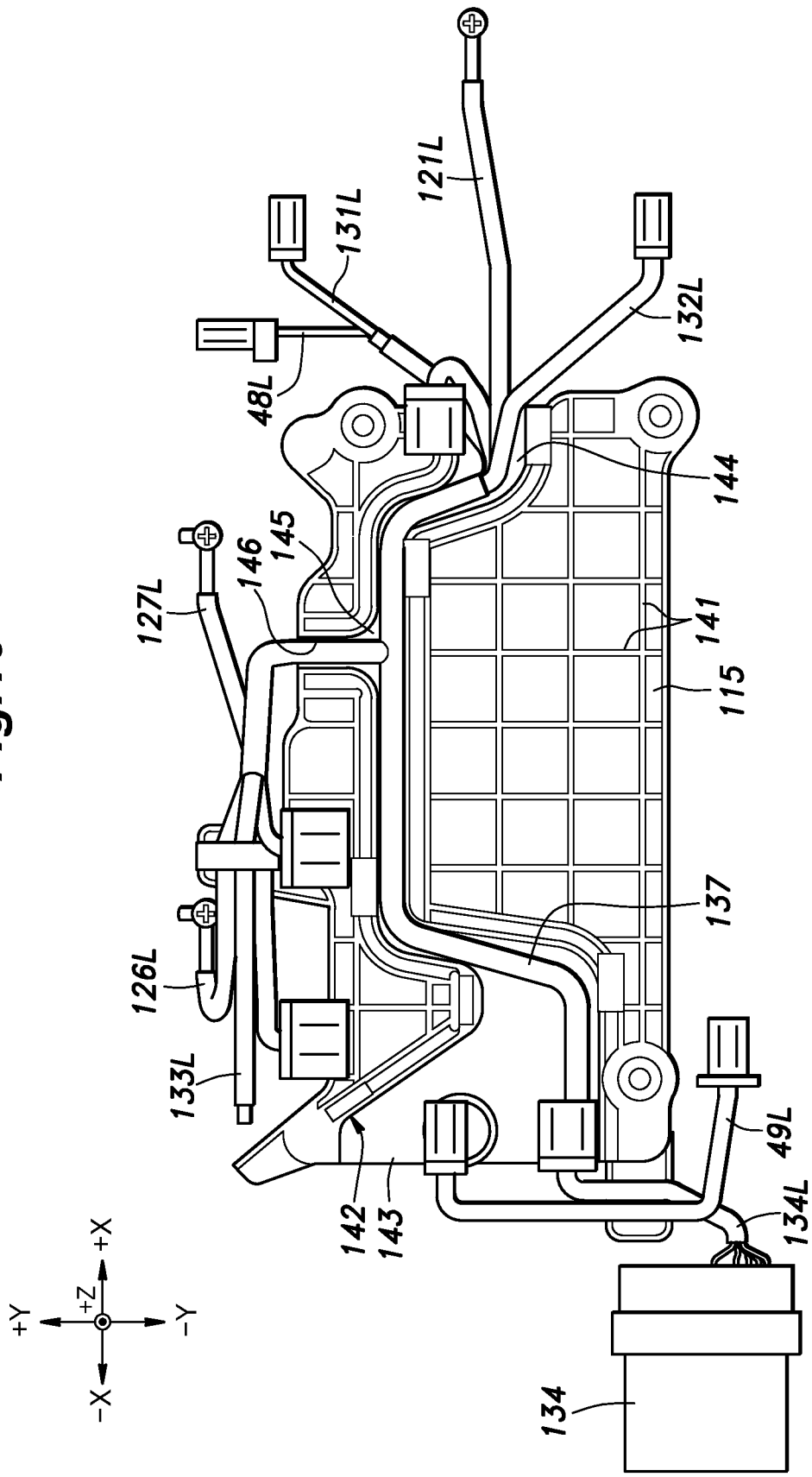
FIG. 10 is a plan view of the support member and a wire harness.

As shown in FIGS. 7 and 10, a wire harness 137 is formed by tying together some of a signal line 48L of the first current sensor 48, a signal line 49L of the second current sensor 49, a signal line 131L of the first reactor temperature sensor 131, a signal line 132L of the second reactor temperature sensor 132, a signal line 133L of the capacitor temperature sensor 133, a signal line 134L of the external connection connector 134, a signal line 121L extending from the first positive bus bar 121, a signal line 126L extending from the sixth positive bus bar 126, and a signal line 127L extending from the negative bus bar 127. The wire harness 137 is branched into a number of terminal ends which are connected to connectors 138 provided on an edge part of the converter ECU 51. The signal lines 121L, 126L, and 127L forward the voltage signals of the bus bars 121, 126, and 127 to the converter ECU 51, and the converter ECU 51 acquires the voltages on the primary side and the secondary side of the FC-side converter 3.

As shown in FIG. 11, a plurality of reinforcing ribs 141 project from the first surface 116 and the second surface 117 of the support member 115. A receiving groove 142 for receiving the wire harness 137 is formed between the adjacent reinforcing ribs 141 on the upper surface of the support member 115. The receiving groove 142 opens toward the +Z side, and extends in the direction along the surface of the support member 115. The receiving groove 142 extends in the X direction, and is provided with a first end 143 that reaches and extends through the side edge of the support member 115 on the −X side and opens toward the −X side and a second end 144 that reaches and extends through the side edge of the support member 115 on the +X side and opens toward the +X side. The receiving groove 142 is further provided with a branch portion 145 branching toward the +Y side from a central point thereof with respect to the X direction. A third end 146 forming the end of the branch portion 145 on the +Y side reaches the front edge of the support member 115 and opens toward the +Y side.

The receiving groove 142 has at least one curved portion 148 at an intermediate part thereof in the lengthwise direction. In particular, the receiving groove 142 is curved instead of being linear. In the present embodiment, the intermediate part of the receiving groove 142 with respect to the X direction is offset to the +Y side with respect to the first end 143 and the second end 144 thereof. The presence of the bend in the receiving groove 142 can improve the bending stiffness of the support member 115. If the receiving groove 142 were formed so as to extend linearly, a weakened part owing to the absence of the reinforcing ribs 141 would extend linearly so that the support member 115 would be prone to bending deformation with the receiving groove 142 serving as a valley or a ridge for such bending deformation. By thus providing the curved portion 148 in the receiving groove 142, the weakened portion is prevented from lining up in a straight line, and the bending stiffness of the support member 115 can be improved.

As shown in FIG. 12, the wire harness 137 extends from the first end 143 to the second end 144 through the receiving groove 142, and extends further from the second end 144 of the receiving groove 142 to the +Z side to be connected to the connectors 138 provided at the edge of the converter ECU 51.

As shown in FIG. 7, the receiving groove 142 is provided with a groove cover 151 which covers at least a part of the wire harness 137. The groove cover 151 is coupled to the support member 115 by means of locking claws or screws. The groove cover 151 retains the wire harness 137 in the receiving groove 142, and prevents the wire harness 137 from being dislodged from the receiving groove 142.

Owing to this arrangement, the wire harness 137 is disposed along the support member 115 as it extends along a space defined between the support member 115 and the converter ECU 51.

The FC-side converter 3 may be disposed in any orientation when mounted to the vehicle. The FC-side converter 3 may be disposed, for example, so that the bottom 61 extends horizontally or vertically.

The effect of the FC-side converter 3 according to the present embodiment is discussed in the following. In the FC-side converter 3, the power module 37 and the secondary side capacitor 35 are stacked in the Z direction via the support plate 88. Since an AC magnetic flux is generated inside each reactor 31 by the current passing through the FC-side converter 3, the reactor 31 needs to have a magnetic path having an appropriate cross sectional area so that the reactor 31 is not magnetically saturated by the magnetic flux. In this case, even if there are severe restrictions such as the need for a high electric capacity, and a small available floor area (footprint) of each reactor 31, an adequate cross sectional area for the magnetic flux can be ensured by making the thickness of the reactor to be greater than either the power module 37 or the secondary side capacitor 35. Therefore, the space efficiency of the FC-side converter 3 can be enhanced by stacking the power module 37 and the secondary side capacitor 35 one over the other, and arranging the reactors 31 separately therefrom.

For the given magnetic characteristics of each reactor 31, the floor area of the reactor 31 can be limited by increasing the thickness of the reactor 31 so as to ensure an adequate cross area for the magnetic flux. Thereby, the space efficiency of the FC-side converter 3 can be optimized. For instance, the floor area of the reactors 31 can be limited even further by making the thickness of the reactors 31A to 31D in the Z direction to be greater than the combined thickness of the power module 37, the support plate 88, and the secondary side capacitor 35 in the Z direction.

In addition, since the secondary side capacitor 35, the power module 37, the gate driver 52, and the converter ECU 51 are stacked in the Z direction in the second region 74, the floor area of the bottom 61 of the case 60 can be further reduced. Further, the outer profile of the second case 64 can be made flat by making the combined thickness of the reactors 31 and the upstream first passage 78 (downstream first passage 79) to be substantially the same as the combined thickness of the secondary side capacitor 35, the support plate 88, the power module 37, the support member 115, and the converter ECU 51. In particular, the external shape of the case formed by the first case 63 and the second case 64 can be made substantially rectangular.

In addition, since the second passage 91 is formed in the support plate 88 which is remote from the second region 74 of the bottom 61, and the power module 37 and the secondary side capacitor 35 are provided on the respective two surfaces of the support plate 88, all of the power module 37 and the secondary side capacitor 35 can be favorably cooled without increasing the floor area.

Since the second region 74 of the bottom 61 does not have a passage through which the cooling medium flows, the second region 74 may be made thinner than the first region 73 so that the receiving space formed on the inner side (+Z side) of the second region 74 can be widened without causing the bottom 61 of the case 60 to protrude outward (−Z side).

Since the wire harness 137 is wired between the converter ECU 51 and the support member 115, clips that are required for securing the wire harness 137 can be partially omitted. In addition, since the signal lines are wired by using the space created between the converter ECU 51 and the support member 115, each device therein can be integrated at high density so that the FC-side converter 3 can be made highly compact.

Since the support member 115 is formed of an insulating material, the converter ECU 51 and the gate driver 52 can be arranged in layers while being insulated from each other. Thereby, the converter ECU 51 and the gate driver 52 can be integrated at high density so that the FC-side converter 3 can be made highly compact.

The receiving groove 142 is formed between the reinforcing ribs 141 on the upper surface of the support member 115, and the wire harness 137 is wired in the receiving groove 142. Therefore, the wire harness 137 is buried in the support member 115 so that the total thickness of the support member 115 can be minimized. In addition, since the wire harness 137 can be held in position by being received in the receiving groove 142, clips required for fixing the wire harness 137 can be partially omitted.

Further, since each end of the receiving groove 142 reaches the corresponding edge of the support member 115, the wire harness 137 can enter the receiving groove 142 from the edge of the support member 115 so that the converter ECU 51 can be disposed even closer to support member 115.

According to the foregoing arrangement of the first to fourth reactors 31A to 31D, the first to fourth switching devices 33A to 33D, the primary side connection portion 23, and the secondary side connection portion 27, in the FC-side converter 3 essentially consisting of a step-up type multiphase converter, the lengths of the first positive bus bar 121 and the negative bus bar 127 through which the largest current flows can be minimized so that the loss can be minimized. In the FC-side converter 3, the largest current flows in the region of the primary side positive line 16 ranging from the primary side positive terminal 21 to the part thereof branching into the first to fourth reactors 31A to 31D which are connected in parallel to one another. In the negative line 18, the largest current flows in the region ranging from the primary side negative terminal 22 to the part thereof branching into the first to fourth switching devices 33A to 33D. In the secondary side positive line 17 and the secondary side of the negative line 18, the voltage is increased so the current is decreased. Therefore, the loss can be reduced most efficiently by shortening the lengths of the first positive bus bar 121 and the negative bus bar 127.

Since the secondary side connection portion 27 is disposed on the +Y side of the power module 37, the distance between the negative terminal 46 of the power module 37 and the secondary side negative terminal 26 can be minimized. Thereby, the negative bus bar 127 can be shortened, and the loss can be minimized.

In the first side wall 66, since the primary side positive terminal 21, the primary side negative terminal 22, the secondary side negative terminal 26, and the secondary side positive terminal 25 are arranged in that order from the +X side, the distance between the negative terminal 22 and the secondary side negative terminal 26 can be minimized so that the length of the negative bus bar 127 can be reduced even further. It should be noted that that this arrangement is not essential for the present invention, and the order of the primary side positive terminal 21, the primary side negative terminal 22, the secondary side negative terminal 26, and the secondary side positive terminal 25 may be changed in other embodiments.

Since the first to fourth reactors 31A to 31D have the primary side on the +X side and the secondary side on the −X side, the loss can be minimized by reducing the lengths of the second to fifth positive bus bars 122 to 125 connecting the first to fourth reactors 31A to 31D to the fourth positive terminals 41 to 44 of the power module 37, respectively.

Although the present invention has been described in terms of a specific embodiment, the present invention is not limited by such an embodiment, but can be modified in various ways without departing from the spirit of the present invention. For example, the number of reactors 31 can be changed. Moreover, the signal lines contained in the wire harness 137 can be changed suitably. A smoothing primary side capacitor may be connected between the primary side positive line 16 and the negative line 18.

In the above embodiment, the first to fourth reactors 31A to 31D had the primary side end on the +X side and the secondary side end on the −X side. In an alternate embodiment, the first to fourth reactors 31A to 31D have the primary side end on the −X side and the secondary side end on the +X side. When the secondary side end is provided on the +X side of the first to fourth reactors 31A to 31D, the lengths of the second to fifth positive bus bars 122 to 125 are longer as compared to the case where the second side end is provided on the −X side of the first to fourth reactors 31A to 31D. However, since the current flowing through the second to fifth positive bus bars 122 to 125 is smaller than that of the first positive bus bar 121, the increase in the loss is minimal.

The invention claimed is:

1. An electric power conversion device, comprising a control unit configured to control a switching device via a gate driver, and a support member that is electrically insulated and supports the control unit, wherein the control unit is a flat plate-shaped electronic control unit formed of a printed circuit board and devices mounted thereof, wherein the support member is provided with a first surface fastened to the control unit, and a second surface facing away from the first surface, a signal line connected to the control unit extends along the first surface, wherein the first surface of the support member is provided with reinforcing ribs, and the signal line is received in a receiving groove formed between adjacent reinforcing ribs.

2. The electric power conversion device according to claim 1, wherein the switching device is placed on the second surface of the support member, and the signal line extends along the first surface.

3. The electric power conversion device according to claim 1, wherein the gate driver is placed on the second surface of the support member.

4. The electric power conversion device according to claim 3, wherein a power module is formed by covering the switching device with mold resin, and the gate driver is connected to an outer side of the power module, the power module being connected to the support member.

5. The electric power conversion device according to claim 4, further comprising a case forming an outer shell of the electric power conversion device, and a support plate connected to an inner side of the case, the support plate internally defining a flow passage in which a cooling medium circulates, and the power module being connected to the support plate.

6. The electric power conversion device according to claim 5, further comprising a capacitor placed on a surface of the support plate facing away from the power module.

7. The electric power conversion device according to claim 6, wherein the signal line comprises a signal line connecting a temperature sensor for detecting a temperature of the capacitor to the control unit.

8. The electric power conversion device according to claim 1, wherein an end of the receiving groove reaches an edge of the support member.

9. The electric power conversion device according to claim 1, wherein the receiving groove is provided with a cover that covers at least a part of the signal line.

10. The electric power conversion device according to claim 1, wherein the receiving groove includes at least one curved portion.

11. The electric power conversion device according to claim 1, wherein the signal line comprises a signal line connecting a first current sensor for detecting an electric current of a power line of a primary side of the electric power conversion device to the control unit.

12. The electric power conversion device according to claim 1, wherein the signal line comprises a signal line connecting a second current sensor for detecting an electric current of a reactor to the control unit.

13. The electric power conversion device according to claim 1, wherein the signal line comprises a signal line connecting a temperature sensor for detecting a temperature of a reactor to the control unit.

14. The electric power conversion device according to claim 1, wherein the signal line comprises a signal line connecting a power line of a primary side or a secondary side of the electric power conversion device to the control unit.

* * * * *